(12) United States Patent
Angle et al.

(10) Patent No.: US 7,557,723 B2
(45) Date of Patent: Jul. 7, 2009

(54) SYSTEM AND METHOD FOR EVALUATING GROUND-FAULT CIRCUIT INTERRUPTERS

(75) Inventors: Jeffrey Richard Angle, Newbury, OH (US); Ronald Wayne Hughes, Thompson, OH (US)

(73) Assignee: Ericson Manufacturing Company, Wiloughby, OH (US)

( * ) Notice: Subject to any disclaimer, the term of this patent is extended or adjusted under 35 U.S.C. 154(b) by 186 days.

(21) Appl. No.: 11/449,350

(22) Filed: Jun. 8, 2006

(65) Prior Publication Data

US 2007/0285266 A1 Dec. 13, 2007

(51) Int. Cl.
*G08B 21/00* (2006.01)
*H02H 3/00* (2006.01)

(52) U.S. Cl. .................. 340/649; 340/650; 340/652; 324/527; 324/528

(58) Field of Classification Search .............. 340/649, 340/650, 638, 641, 657; 361/42, 44, 79, 361/93, 115, 93.1; 324/509, 527, 528, 536; 335/17
See application file for complete search history.

(56) References Cited

U.S. PATENT DOCUMENTS

| 5,729,145 A | * | 3/1998 | Blades | 324/536 |
| 6,577,478 B2 | * | 6/2003 | Kim et al. | 361/42 |
| 6,744,254 B2 | * | 6/2004 | Clarey et al. | 324/424 |
| 7,030,769 B2 | * | 4/2006 | Miller | 340/635 |
| 7,079,365 B2 | * | 7/2006 | Brown et al. | 361/42 |

* cited by examiner

*Primary Examiner*—Toan N Pham
(74) *Attorney, Agent, or Firm*—McAndrews, Held & Malloy, Ltd.

(57) ABSTRACT

A system for evaluating at least one tripping stimulus for a ground-fault circuit interrupter includes: a sensing circuit configured to measure a leakage current from a voltage line to ground, wherein the sensing circuit is capable of generating a leakage signal including a voltage representative of the leakage current; and an evaluating circuit configured to evaluate the leakage signal to generate an indication signal, wherein the indication signal includes information corresponding to the at least one tripping stimulus. The sensing circuit may include a circuit substantially similar to at least a portion of a ground-fault circuit interrupter, and the evaluating circuit may include a peak hold circuit. The system may further include an indicator circuit for receiving the indication signal and displaying a status of the tripping conditions.

19 Claims, 3 Drawing Sheets

SYSTEM AND METHOD FOR EVALUATING GROUND-FAULT CIRCUIT INTERRUPTERS

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The presently described technology relates generally to evaluation of ground-fault circuit interrupters (hereinafter "GFCI"). In particular, the present technology relates to a system and method for testing the condition or status of a GFCI.

Safety in electronic appliances and devices has become an increasing concern. Receptacles installed in homes or businesses may be capable of protecting people from injury when ground-fault conditions occur. Thus, GFCIs may be configured to interrupt electrical current upon detection of a ground-fault condition occurring at an alternating current (AC) load.

Many electrical wiring devices including receptacles have a line side that is connectable to an electrical power supply, a load side that is connectable to one or more loads, and at least one conductive path between the line side and the load side. When a person comes in contact with the line side of the AC load and an earth ground at the same time, injury may occur because the human body may form a conductive path for the electrical current to flow through.

GFCI devices may detect a ground-fault condition and break the electric power supply by employing a sensing transformer to detect an imbalance between the currents flowing in a phase (also known as "hot") conductive path and neutral conductive path of a power supply. A ground-fault condition happens when the current is diverted to the ground through another path (e.g. a human body), that results in an imbalance between the currents flowing in the phase and neutral conductive paths. Upon detection of a ground-fault condition, a breaker or other disconnecting mechanism in a GFCI device is tripped to interrupt the electrical continuity.

A revision of the National Electric Code, NFPA 70, requires GFCIs to be installed in more locations than previously required. For example, GFCIs are now required in some situations within residences, closer to sinks, at washing machines, and outdoors. Some of these locations may be known to promote increased leakage of current to ground, such as outdoor locations and locations near water sources. The proliferation of GFCIs in more extreme environments may lead to increased tripping of GFCIs.

At the same time, certain appliances are designed to allow an increased amount of leakage of current to ground. For example, computers are known to allow a relatively large amount of leakage to ground. Such "leaky" appliances and electronic devices may also lead to increased tripping of GFCIs.

Often, a GFCI trip is a nuisance, in that it does not represent a true fault to ground. For example, a GFCI may have a tripping threshold of 5 mA. A computer may allow 3 mA of leakage. Two computers being supplied power through a GFCI may, then, allow 6 mA of leakage, thereby tripping the GFCI, even there is no "true" ground-fault. Such tripping of GFCI devices may be considered a nuisance.

When a GFCI device is repeatedly tripping, it may be difficult to determine the cause of the tripping. For example, the GFCI may, itself, be faulty. Alternatively, the GFCI may be operating properly, but the ambient leakage may be relatively high. Alternatively, noise-causing devices may cause tripping. As yet another possibility, leaky appliances or electronic devices may cause tripping. (See below.)

Determining whether the GFCI is defective and self-tripping or if the appliance connected to the GFCI is causing it to trip may be time consuming and difficult. Determining which appliance, leakage source, and/or noise source is causing tripping may be particularly difficult because of the intermittent nature of certain nuisance tripping. Simply plugging an appliance into another GFCI or plugging a different appliance into the same GFCI may not give a result or may give a misleading result because a nuisance trip phenomena may frequently be a combination of electrical noise plus leakage to ground due moisture or humidity. Such tripping factors (e.g. noise, leakage) may vary over time, further complicating the task of identifying tripping conditions.

Thus, there is a need for methods and systems that can efficiently diagnose tripping conditions on power lines and/or ground that cause tripping of a GFCI device. There is also a need for methods and systems that can identify conditions on a power line that may cause tripping. There is another need for methods and systems that can enhance the usability of GFCI devices by identifying circumstances under which they can properly trip, and circumstances under which tripping may be a nuisance. Additionally, there is a need for a cost-effective instrument that can efficiently diagnose tripping conditions to determine whether tripping of a GFCI device is a nuisance (e.g. noise and/or ambient leakage), a defect in the GFCI device itself, or a defective appliance. The presently described technology can meet at least one of these needs.

BRIEF SUMMARY OF THE INVENTION

In one aspect, the presently described technology provides a system for evaluating at least one tripping stimulus for a ground-fault circuit interrupter. The system includes: a sensing circuit configured to measure at least one tripping stimulus from a voltage line to ground, therein said sensing circuit is capable of generating a stimulus signal comprising a voltage representative of said at least one tripping stimulus; and an evaluating circuit configured to evaluate said stimulus signal to generate an indication signal, wherein said indication signal comprises information corresponding to said at least one tripping stimulus. The evaluating circuit may include a peak hold circuit. The system may further include an indicator circuit for receiving said indication signal and displaying a status of said at least one tripping stimulus. In accordance with at least one embodiment of the presently described technology, the sensing circuit and the evaluating circuit of the system may be capable of drawing power from the voltage line. The system of the present technology may further include an indicator circuit for receiving the indication signal and displaying a status of the tripping conditions; a circuit for causing a fault in a ground-fault circuit interrupter; and/or a circuit for evaluating whether a neutral line is grounded. A correspondence between the leakage current and the leakage signal may be substantially instantaneous. Also, the indication signal may include a voltage representative of a peak voltage on the leakage signal and a substantially instantaneous voltage on the leakage signal.

In another aspect, the presently described technology provides an apparatus for evaluating at least one tripping stimulus for a ground-fault circuit interrupter. The apparatus includes a sensing circuit configured to sense a difference in currents between at least two conductors, the sensing circuit is capable of providing a first signal indicative of the difference in currents between the at least two conductors; and an evaluator circuit configured to evaluate the first signal to form a second signal, wherein the second signal includes status information of the tripping condition for communication to a user. The apparatus of the present technology may further include an indicator circuit for displaying the status information; an alternating current wiring a testing circuit; a circuit for indicating whether a neutral line is connected to ground; and/or a circuit for causing a fault condition in a ground-fault circuit interrupter.

In yet another aspect, the presently described technology provides a method for testing a tripping condition for a ground-fault circuit interrupter. The method includes the steps of measuring a current leakage on power lines capable of being regulated by a ground-fault circuit interrupter; forming a first signal representative of the current leakage; and evaluating the first signal to form a second signal indicative of the tripping condition for the ground-fault circuit interrupter. In accordance with at least one embodiment of the present technology, the first signal may correspond substantially instantaneously to the current leakage. The second signal may include information corresponding to at least one of the following: (1) current leakage between the power lines and ground; (2) noise on the power lines; and (3) whether a neutral line of the power lines is connected to the ground. The step of evaluating the first signal may include holding a peak voltage of the signal representative of the current leakage to form at least in part the second signal. The second signal may include status information corresponding to a status of the ground-fault circuit interrupter. Further, at least a portion of the second signal may be storable in an electronically readable memory.

Figure 1:
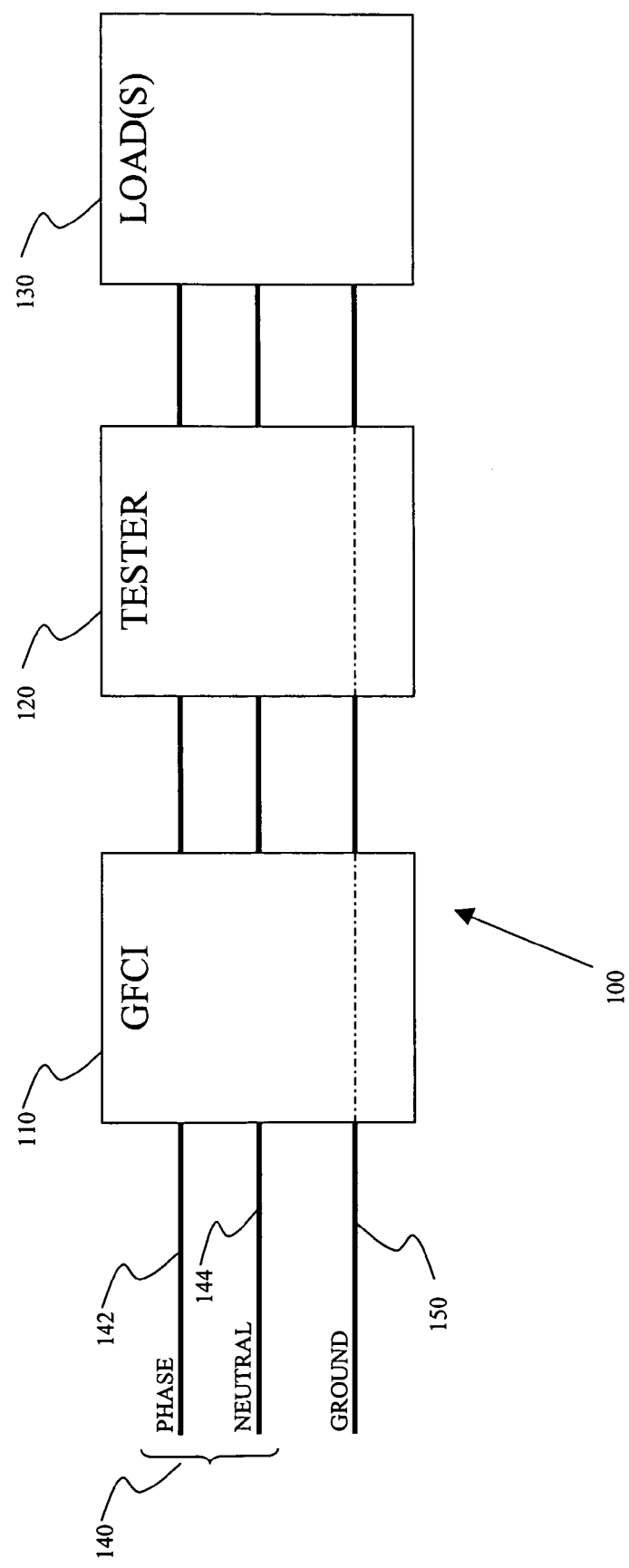
FIG. 1 illustrates a schematic representation of a system for evaluating GFCI tripping conditions, according to an embodiment of the present invention.

The foregoing summary, as well as the following detailed description of certain embodiments of the present application, will be better understood when read in conjunction with the appended drawings. For the purpose of illustrating the invention, certain embodiments are shown in the drawings. It should be understood, however, that the present invention is not a limited to the arrangements and instrumentality shown in the attached drawings.

DETAILED DESCRIPTION OF THE INVENTION

FIG. 1 shows a system 100 for evaluating a GFCI, according to an embodiment of the present invention. The system 100 may include power lines 140, ground 150, a GFCI 110, a tester 120, and one or more loads 130. While the system 100 may be arranged as shown, alternative arrangements are conceivable. For example, the tester 120 may be upstream from the GFCI 110. As another example, the tester 120 may be placed in between two or more loads 130. As another example, the GFCT 110 may be omitted The power lines 140 may provide alternating current (e.g. 50 or 60 Hz). The power lines 140 may have a line voltage across the lines, such as 110 VAC, 120 VAC, or 220 VAC. Generally, the line voltage may vary around a particular rating. Of course, other possibilities exist for line voltages (e.g. 240 VAC, 115 VAC, etc.). The power lines 140 may include at least one phase line 142 (a phase line may also be called a hot line) and a neutral line 144. The power lines 140 may be single phase, or multiple phase (i.e., including two or more phase conductors).

The GFCI 110 may be any type of device for monitoring an imbalance between the current(s) on the at least one phase line 142 and the neutral line 144. The GFCI 110 may employ a current transformer, such as a differential current transformer, torroidal transformer, or the like to measure the net current across the power lines 140. Under ideal no-fault conditions (or no leakage conditions), the current in the at least one phase line 142 and the neutral line 144 should be identically complimentary. Thus the net current of the at least one phase line 142 and the neutral line 144 should be zero. If the net current is not zero, then some current may be leaking to the ground 150. Thus, the GFCI 110 may directly sense attributes of the power lines 140. At the same time, the GFCI 110 may not directly sense any attribute related to the ground 150, and therefore the ground 150 is shown in dotted line in the GFCI 110 in FIG. 1.

The GFCI 110 may be capable of interrupting a flow of power based on trigger or tripping conditions sensed from the power lines 140. A tripping condition may be any condition on the power lines 140 that can cause the GFCI 110 to interrupt a flow of power. Tripping conditions may include, for example, a leakage of current from the power lines 140 to the ground 150. Another example of tripping conditions may be noise on or near the power lines 140. Examples of types of noise include, but are not limited to inductive noise, radiated noise, conducted noise, switching noise, and/or the like. Tripping conditions may be caused by a single source (e.g leakage current) or by a combination of sources (e.g. leakage current plus noise). Such sources may be called tripping stimuli, even if any single source by itself is insufficient to trip a GFCI 110.

The GFCI 110 may be capable of sensing a current imbalance and interrupting the flow of power to the one or more loads 130. For example, the GFCI 110 may detect an imbalance of 5-6 mA between the at least one phase line 142 and the neutral line 144 to trigger interruption. Preferably, the GFCI 110 may be capable of detecting a current imbalance in 25 mS or less. The GFCI 110 may also be tripped due to noise, such as inductive noise, switching noise, RF noise, arcing, or the like.

The one or more loads 130 may include any type of electrical loads. For illustrative purposes, FIG. 1 shows only one load, but more loads can be present (e.g. in series, parallel, etc). Various types of loads include, for example, resistive loads, inductive loads, capacitive loads, appliances, electronic devices, switching devices, etc. A load may be across the power lines 140.

Current may also flow through other paths, such as one or more leakage paths. A leakage path may be a resistance between the power lines 140 to ground 150. A leakage path may be of a relatively high resistance, for example, and may vary based on any of a variety of ambient conditions, for example.

The tester 120 may be capable of testing the GFCI 110. The tester 120 may also be configured to evaluate the tripping conditions in a given electrical system, whether or not the GFCI 110 is present. The tester 120 may be configured to gather and/or present information from the power lines 140. The tester 120 may be powered from the power lines 140, or from some other power source (e.g. batteries). The tester 120 may be substantially isolated from the ground 150. The tester 120 may include a display (e.g. LCD) or indicators (e.g. LEDs) for visually communicating information about the status of tripping conditions (e.g. the aggregate of the various tripping stimuli). The status of tripping conditions may be, for example, that the GFCI 110 should or should not be tripping. Other examples of the status of tripping conditions may include an amount of leakage current from the lines 140 to the ground 150, or the presence of potentially disrupting noise signals (e.g. a quantity and/or quality of noise on the lines 140). In accordance with at least one embodiments of the present technology, the tester 120 may sense current leakage in much the same way as the GFCI 110 senses the current leakage (e.g. sensing the net current on the phase line 142 and the neutral line 144). The tester 120 may also include a processor such as a microcontroller, microprocessor, central processing unit, digital signal processor, and/or the like. The tester 120 may further include a memory for storing information. For example, the status of the tripping conditions may be stored in a memory. In accordance with at least one embodiments of the present technology, the tester 120 may be a hand-held device pluggable into an outlet.

The tester 120 may include a feature for causing a fault or a fault condition for the GFCI 110. Such a feature may include, for example, a resistor for diverting leakage current from the lines 140 (e.g. the at least one phase line 142) to the ground 150. A user may be able to push a switch (e.g. mechanical or electronically actuated) or other type of device for putting the resistor across the lines 140 and the ground 150. Such a feature may be capable of causing a current leakage sufficient to trip the GFCI 110.

The tester 120 may also include a circuit for evaluating whether the neutral line 144 is electrically connected to the ground 150. Neutral-to-ground evaluation may be accomplished using two current transformers. In a typical building, the neutral line 144 may be connected to ground 150 upstream of the tester 120 or the GFCI 110. When the neutral line 144 is also connected to ground downstream of the GFCI 110, it causes a single turn linkage between the two current transformers. The resulting increase in magnetic coupling may be detected by the GFCI 110, causing a trip.

The tester 120 may also include one or more circuits for testing wiring of the lines 140 and/or the ground 150. Such circuit(s) may be known, for example, as an "electrician's friend." In accordance with at least one embodiment of the present technology, the tester 120 may include such a circuit for evaluating whether the power lines 140 and/or the ground 150 is wired correctly. Wiring testing may be accomplished using a network of diodes, LEDs, other solid state devices, and/or resistors to indicate presence of power, presence of ground, and/or proper phase connections. For example, the tester 120 may be capable of determining whether the neutral line 144 and the at least one phase line 142 are reversed. For another example, the tester 120 may be capable of determining whether the ground 150 is connected to an actual ground. The tester 120 may also be capable of determining whether other wiring errors are present—e.g., the phase line 142 is at the ground 150, the neutral line 144 is at the ground 150, the at least one phase line 142 is open, the neutral line 144 is open, etc.

Generally speaking, it can be helpful to position the tester 120 proximally to the GFCI 110. By positioning proximally, it may be inferred that the character of the lines 140 (e.g. leakage, noise, etc.) may be similar with respect to both the GFCI 110 and the tester 120. For example, if the GFCI 110 is located in an outlet, the tester 120 may be pluggable into such an outlet containing the GFCI 110. Of course, it may not necessary to place the tester 120 in any particular location along the lines 140.

Figure 2:
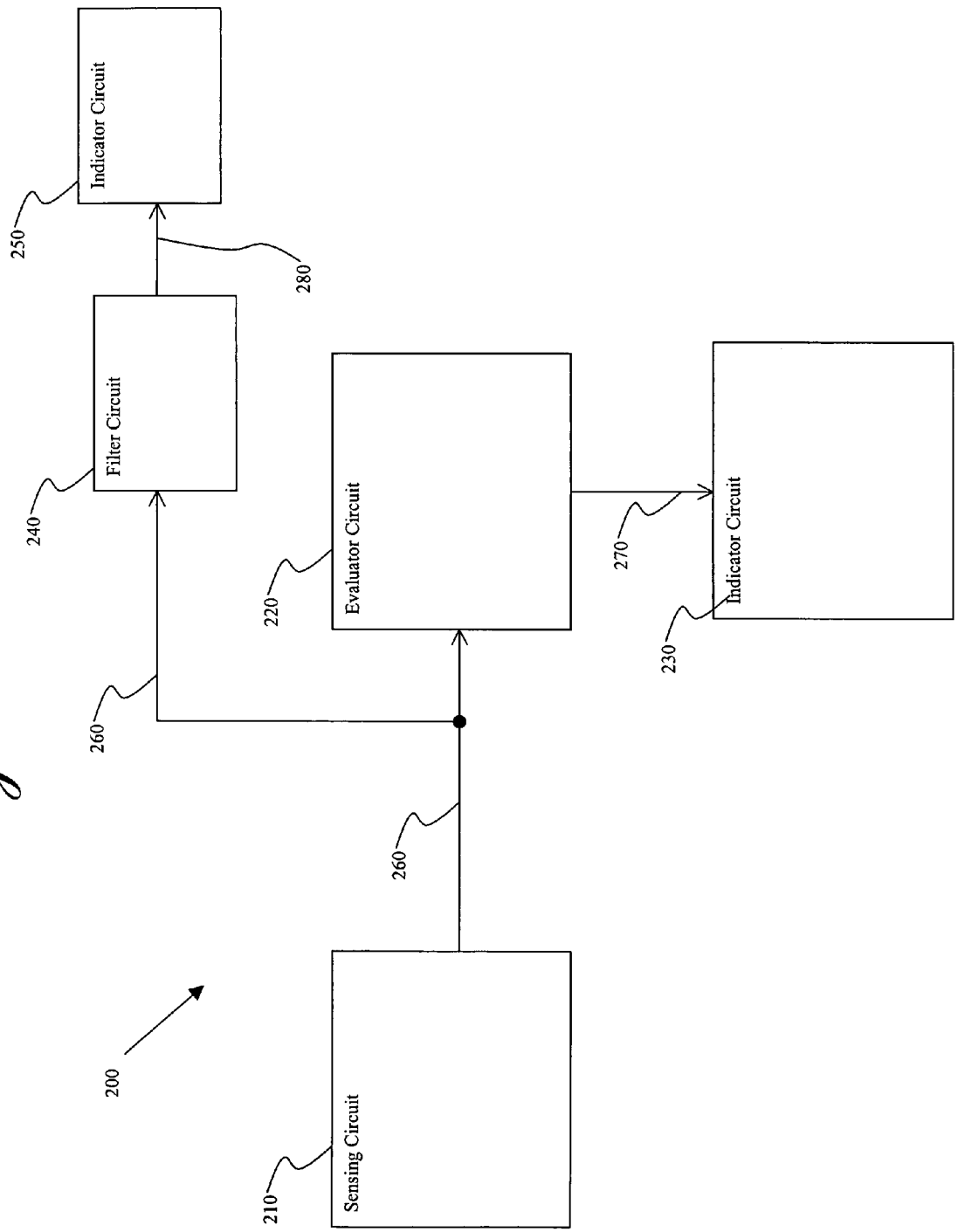
FIG. 2 illustrates a schematic representation of a system for evaluating GFCI tripping conditions, according to an embodiment of the present invention.

FIG. 2 shows a system 200 for evaluating a GFCI, according to an embodiment of the present invention. The system 200 may be substantially similar to aspects of the tester 120 in FIG. 1. The system 200 may include a sensing circuit 210, an evaluator circuit 220, one or more indicator circuits 230, 250, and/or a filter circuit 240.

The sensing circuit 210 may sense a signal across a power line (e.g., the lines 140 in FIG. 1) in a manner substantially similar to the GFCI 110 in FIG. 1. For example, the sensing circuit 210 may employ a current transformer, such as a differential current transformer to measure the net current across the power lines (e.g. the power lines 140 of FIG. 1). Under ideal no-fault conditions, the current in phase and neutral lines should be identically complimentary. Thus the net current of the phase and neutral lines should be zero. If the net current is not zero, then some current may be leaking to ground. Thus, the sensing circuit 210 may directly sense attributes of the power lines. At the same time, the sensing circuit 210 may not directly sense any attribute related to the ground, but may sense ground-related attribute(s) indirectly.

The sensing circuit 210 may provide a signal 260. The signal 260 may have a voltage that corresponds substantially to the instantaneous conditions on the power lines (e.g. power lines 140 shown in FIG. 1). Of course, the sensing circuit 210 or other factors may add insubstantial delays between the signal on the line and the corresponding output signal 260. The signal 260 may correspond to the amount of detected leakage current on the power line. The signal 260 may be proportional to the detected leakage current on the power line, or may represent some other relationship. The signal 260 may further be processed, filtered, and/or the like by other components in the system 200.

The sensing circuit 210 may also generate an output, which can form part of the signal 260 or a separate signal, that is useful for detecting whether the ground (e.g. the ground 150 in FIG. 1) is electrically connected with a neutral line (e.g. the neutral line 144 in FIG. 1). For example, the sensing circuit 210 can generate a high frequency output component if it detects that a neutral line is electrically connected with the ground. This high frequency output component may be included in the signal 260 or form a separate signal.

The evaluator circuit 220 may receive the signal 260 and provide a corresponding evaluation signal 270. As discussed, the signal 260 may correspond to substantially instantaneous conditions on the power line (e.g. the power line 140 of FIG. 1). The evaluator circuit 220 may evaluate the signal 260 and generate the corresponding evaluation signal 270. The evaluation may be performed by analog circuitry and/or digital circuitry. The evaluation may also be performed through a processor (e.g., a microprocessor or a digital signal processor), or through filters, amplifiers, and/or other components. Moreover, evaluation results may be stored in a memory.

One method of evaluation may be filtering the signal 260 with a peak hold circuit. The peak hold circuit may generate an output signal where a peak input voltage is maintained/driven on the output for a period of time. For example, the peak hold circuit may sense a peak voltage on the signal 260, and hold that peak voltage to generate the corresponding evaluation signal 270. In such a manner, the peak GFCI triggering stimuli level(s) may be represented by the signal 270 over a period of time. The signal 270 may represent the aggregate of triggering stimuli, for example.

The evaluator circuit 220 may also include other types of circuits. For example, a filter may be included on the input to remove transient spikes of a certain duration. The evaluation circuit may also include digital evaluation components, and/or a memory. It may be possible, for example, to store a signal obtained over time in the memory, and then retrieve the stored signal (either through the system 200, or through another device, such as an external computer) and subsequently process it.

The evaluator circuit 220 may drive the signal 270 that includes a processed or filtered signal, and/or the substantially instantaneous signal. As discussed, the signal 270 may include the output from a peak hold circuit. Other possibilities include a time-average filter, integrator, and/or lossy integrator. Various aspects of the evaluator circuit 220 may be alterable/adjustable. For example, the hold time on the peak hold circuit may be adjustable. The output voltage level may be adjustable. Various filter responses may be adjustable. And duration of time-averaging windows may also be adjustable. Adjustment/alteration may be performed manually (e.g. set screw, trim potentiometer, trim capacitor, dip switch, etc.) or electrically (e.g. programmable microprocessor).

The indicator circuit 230 can receive the signal 270 (which includes evaluation information) and alter/maintain the status of one or more indicators based on the signal 270. Example types of indicators include LCDs, LEDs, lamps, CRTs, and/or the like. The indicator circuit 230 may turn on one or more LEDs if the signal 270 is above a certain threshold. The indicator circuit 230 may be adjustable (e.g. different threshold for indicating GCFI fault triggering status). The indicator circuit 230 may include a processor (e.g. microprocessor), and/or a memory. The indicator circuit 230 may display signal 270 that the adjacent GFCI 110 will also sense. This may include most tripping stimuli except the grounded neutral stimulus 280 that can be displayed separately on indicator 250. The indicator circuit 230 may drive an LCD or other circuit based on the signal 270.

The indicator circuit 230 may have indicators for indicating an amount of noise, or a type of noise. For example, the indicator circuit 230 may have an indicator for indicating that there is a character of noise on the line that may interfere and/or trip the GFCI 110.

The filter circuit 240 may be useful for filtering a high frequency component indicative of a grounded neutral condition. The filter circuit 240 may receive an input with a signal (e.g., the signal 260 or a separate signal not shown in FIG. 2), and filter the signal to generate a filtered output 280. The filtered output signal may be fed to another indicator circuit 250. The indicator circuit 250 may drive an indicator (e.g. LED, or other lamp) if the filtered output 280 is over a certain threshold. The status of the indicator (e.g an LED is lit) may indicate whether a grounded neutral condition exists.

Figure 3:
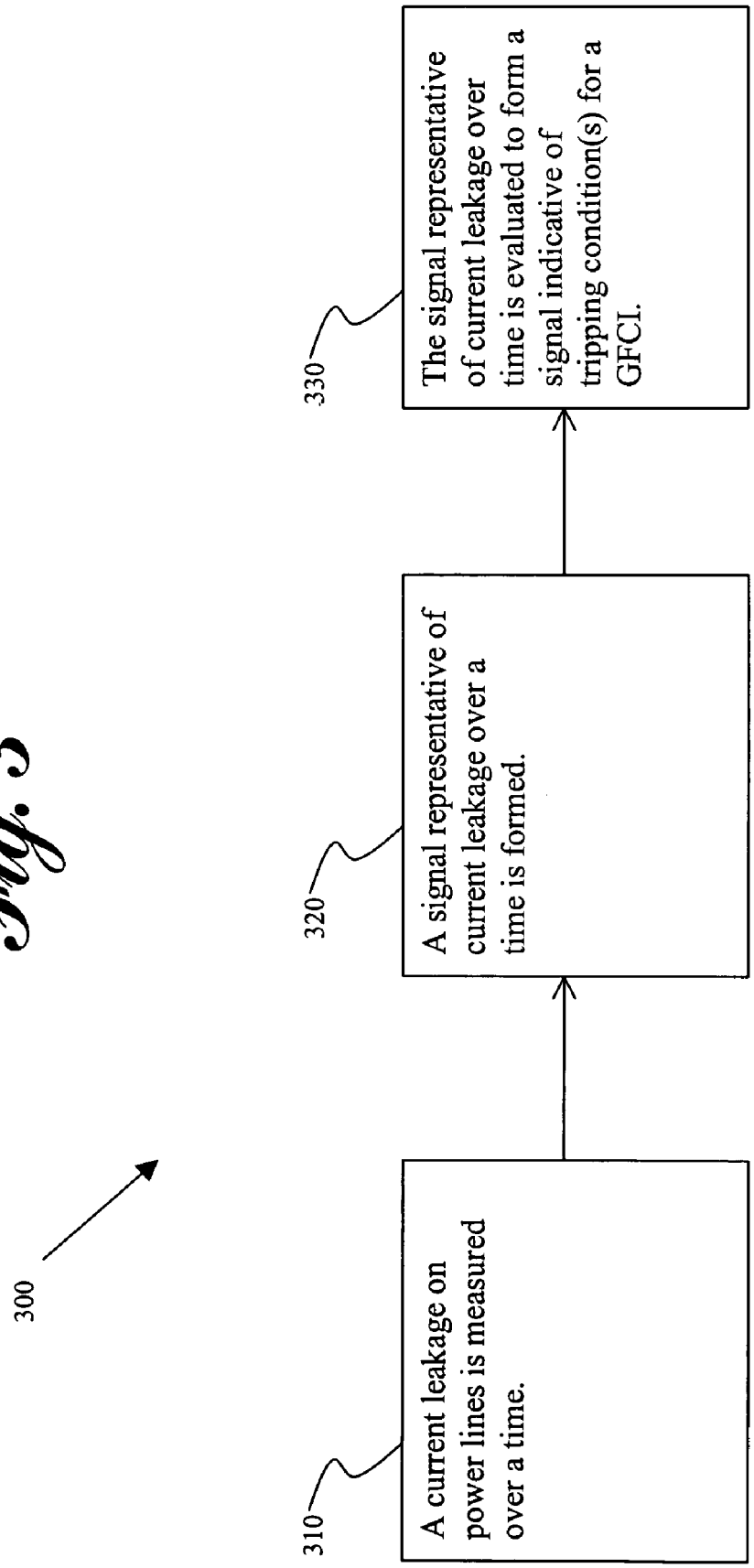
FIG. 3 illustrates a flowchart for a method for testing a GFCI, according to an embodiment of the present invention.

FIG. 3 shows a flowchart of a method 300 for testing a GFCI, according to an embodiment of the present invention. The steps of the method 300 may be performed in an alternate order as shown. Alternatively, at least some of the steps of the method 300 may be performed simultaneously or substantially simultaneously. Furthermore, some steps of the method 300 (or portions thereof) may be omitted. All or part of the steps of the method 300 may be performed by a computer and/or other processor executing a set of instructions on a computer-readable medium.

At step 310, a current leakage on power lines is measured over a time. The power lines may be, regulated by a GFCI (e.g. the GFCI 110 in FIG. 1). For example, a tester (e.g. the tester 120 in FIG. 1) may employ a sensing circuit (e.g. the sensing circuit 210 in FIG. 2) to measure a current leakage over the time. A current transformer, such as a differential current transformer, may be used to measure the net current across power lines (e.g. the power lines 140 in FIG. 1). Under ideal no-fault conditions, the current in phase and neutral should be identically complimentary. Thus the net current of the phase and neutral should be zero. If the net current is not zero, then some current may be leaking to ground.

At step 320, a signal representative of the current leakage over the time is formed. The signal may be generated by, for example, a current transformer, such as a differential current transformer. The signal may further be amplified, and/or filtered depending on other design considerations. The level of the signal may be adjustable manually and/or electronically. The signal may represent a substantially instantaneous value with respect to line conditions.

At step 330, the signal representative of current leakage over time is evaluated to form a signal indicative of one or more tripping condition(s) for a GFCI. The signal may be evaluated by, for example, an evaluator circuit (e.g. the evaluator circuit 220 in FIG. 2). As discussed, the evaluator circuit may include a peak hold circuit. The evaluator circuit may evaluate the signal to determine whether any triggering stimulus/stimuli are present on the line. Triggering stimuli may include leakage current greater than an amount (e.g. 5 mA), noise of a certain amplitude and/or character, and/or the like.

As an illustrative example, the method 300 may be performed in the following manner. A single device houses all the components indicated in FIG. 2. The device receives phase and neutral, and outputs the same. The device draws a relatively small amount of power from the power line it is testing. Inside the device, the phase and neutral conductors are looped through a differential current transformer, which forms a part of the sensing circuit 210. At step 310, the differential current transformer portion of the sensing circuit 210 detects substantially instantaneously a current leakage from the line to ground.

At step 320, the current transformer generates a signal substantially proportional to the detected leakage current on the line. The signal is further conditioned (e.g. amplified) for transmission to the evaluator circuit. The signal generated is substantially proportional to the current leakage on the line detected by the current transformer. Other relationships are also possible (e.g. curve, quadratic, logarithmic, etc.).

At step 330, the evaluator circuit 220 receives the signal, and evaluates whether a GFCI triggering stimulus exists on the line. In this particular illustrative example, the evaluator circuit 220 includes a peak hold circuit, although an integrator or lossy integrator may also be implemented. The peak hold circuit receives the substantially instantaneous signal, and drives an output signal that maintains a peak value of the substantially instantaneous signal. Thus, transient spikes are detected and maintained on the signal line. The output signal, thus, contains information that is representative of tripping conditions, and thus whether a GFCI may be falsely or correctly responding to triggering conditions.

Thus, aspects of the presently described technology provide methods and systems that can efficiently diagnose tripping conditions on power lines and/or ground causing tripping of a GFCI device. Additionally, aspects of the presently described technology provide methods and systems that identify conditions on a power line that may cause tripping. Aspects of the presently described technology provide methods and systems that enhance the usability of GFCI devices by identifying circumstances under which they properly trip, and under circumstances which tripping is a nuisance. Aspects of the presently described technology provide a cost-effective instrument that can efficiently diagnose tripping conditions to determine whether tripping of a GFCI device is a nuisance (e.g. noise and/or ambient leakage), a defect in the GFCI device itself, or a defective appliance.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. For example, features may be implemented with software, hardware, or a mix thereof. Therefore, it is intended that the invention not be limited to the particular embodiment disclosed, but that the invention will include all embodiments falling within the scope of the appended claims.

What is claimed is:

1. A testing system for evaluating at least one tripping stimulus for a separate ground-fault circuit interrupter device comprising:
   a sensing circuit configured to measure a leakage current from a power line to ground, wherein said sensing circuit is capable of generating a leakage signal representative of said leakage current;
   an evaluating circuit configured to evaluate said leakage signal to generate an indication signal, said indication signal varying over time in response to said leakage signal; and
   an indicator circuit for receiving said indication signal and displaying a status of said leakage, said indicator circuit capable of variably indicating a quantity of said leakage current.

2. The system of claim 1, wherein said evaluating circuit comprises a peak hold circuit.

3. The system of claim 1, wherein said indicator circuit comprises a plurality of light emitting diodes.

4. The system of claim 1, wherein said sensing circuit comprises a circuit substantially similar to at least a portion of a ground-fault circuit interrupter.

5. The system of claim 1, wherein said sensing circuit and said evaluating circuit are capable of drawing power from said voltage line.

6. The system of claim 1 further comprising a circuit for causing a fault in a ground-fault circuit interrupter.

7. The system of claim 1 further comprising a circuit for evaluating whether a neutral line is grounded.

8. The system of claim 1, wherein said indication signal comprises a voltage representative of a peak voltage on said leakage signal.

9. A tester for evaluating at least one tripping stimulus for a separate ground-fault circuit interrupter comprising:
   a sensing circuit configured to sense a difference in currents between at least two conductors, said sensing circuit is capable of providing a first signal indicative of said difference in currents between said at least two conductors; and
   an evaluator circuit configured to evaluate said first signal to form a second signal, wherein said second signal comprises variable status information of said difference in currents between said at least two conductors displayable to a user; and
   an indicator circuit for variably displaying said status information.

10. The tester of claim 9 wherein said indicator circuit comprises a plurality of light emitting diodes.

11. The tester of claim 9 further comprising an alternating current wiring testing circuit.

12. The tester of claim 9 further comprising a circuit for indicating whether a neutral line is connected to ground.

13. The tester of claim 9 further comprising a circuit for causing a fault condition in the separate ground-fault circuit interrupter.

14. A method for testing a tripping condition for a separate ground-fault circuit interrupter comprising:
   measuring a current leakage on power lines capable of being regulated by a ground-fault circuit interrupter;
   forming a first signal representative of said current leakage;
   evaluating said first signal to form a variable second signal indicative of said leakage; current and
   variably indicating said second signal.

15. The method of claim 14, wherein said second signal is variably indicated with a plurality of light emitting diodes.

16. The method of claim 14, wherein said second signal comprises information corresponding to at least one of: current leakage between said power lines and ground; noise on said power lines; and whether a neutral line of said power lines is connected to said ground.

17. The method of claim 14, wherein the step of evaluating said first signal comprises holding a peak voltage of said first signal representative of said current leakage to form at least in part said second signal.

18. The method of claim 14, wherein said second signal comprises status information corresponding to a status of the separate ground-fault circuit interrupter.

19. The method of claim 14, wherein at least a portion of said second signal is storable in an electronically readable memory.

* * * * *